(12) United States Patent
Taylor et al.

(10) Patent No.: US 12,704,562 B2
(45) Date of Patent: Aug. 11, 2026

(54) METHOD AND APPARATUS FOR DETERMINING THE STATUS OF A CONTACTOR

(71) Applicant: Cox Automotive, Inc., Atlanta, GA (US)

(72) Inventors: Connor Benjamin Taylor, Norman, OK (US); David Keith Howland, Yukon, OK (US)

(73) Assignee: Cox Automotive, Inc., Atlanta, GA (US)

( * ) Notice: Subject to any disclaimer, the term of this patent is extended or adjusted under 35 U.S.C. 154(b) by 163 days.

(21) Appl. No.: 18/646,293

(22) Filed: Apr. 25, 2024

(65) Prior Publication Data

US 2025/0334651 A1 Oct. 30, 2025

(51) Int. Cl.
*G01R 31/66* (2020.01)

(52) U.S. Cl.
CPC .................................... *G01R 31/66* (2020.01)

(58) Field of Classification Search
CPC ... G01R 31/66; G01R 31/006; G01R 31/3277
USPC ........................................................ 324/76.11
See application file for complete search history.

(56) References Cited

U.S. PATENT DOCUMENTS 4,335,348 A * 6/1982 Reed ....................... G01R 31/58 324/529
4,864,285 A * 9/1989 Rodden .................. G01R 31/66 324/415
5,446,682 A * 8/1995 Janke ................ G01R 31/1272 340/650
5,514,964 A * 5/1996 Benesh .................. G01R 31/52 324/509
6,580,990 B2 * 6/2003 Wager .................. B62D 5/0487 340/439
2006/0043981 A1 * 3/2006 Drouin ................... G01R 31/14 324/713
2010/0259280 A1 * 10/2010 Thiede .............. G01R 31/1227 324/547
2011/0291672 A1 * 12/2011 Huttinger ............... G01R 31/27 324/649
2012/0194200 A1 * 8/2012 McDiarmid ........... G01R 31/74 324/509
2017/0205455 A1 * 7/2017 Weicker ............. G01R 31/3277
2023/0296674 A1 * 9/2023 Scholz ................. G01R 31/327 324/415

* cited by examiner

*Primary Examiner* — Christopher P Mcandrew
(74) *Attorney, Agent, or Firm* — Merchant & Gould P.C.

(57) ABSTRACT

System and method for determining a status of a contactor is provided. An excitation signal is generated. The excitation signal is propagated towards a contactor. A a peak value of a resulting signal resulting from a reflected signal reflected from the contactor and the excitation signal is detected. The peak value is compared with a predetermined value. The contactor is determined as welded in response to determining that the peak value is greater than the predetermined value.

20 Claims, 6 Drawing Sheets

METHOD AND APPARATUS FOR DETERMINING THE STATUS OF A CONTACTOR

BACKGROUND

Electrochemical devices, for example, a rechargeable battery, a storage battery, a secondary cell, or an accumulator is a type of electrical battery that can be charged, discharged into a load, and recharged many times. Rechargeable batteries are produced in many different shapes and sizes, ranging from button cells to megawatt systems connected to stabilize an electrical distribution network. Several different combinations of electrode materials and electrolytes are used, including lead-acid, nickel cadmium (NiCd), nickel metal hydride (NiMH), lithium ion (Li-ion), and lithium ion polymer (Li-ion polymer).

Rechargeable batteries are used for many applications including powering automobiles, portable consumer devices, light vehicles (such as motorized wheelchairs, golf carts, electric bicycles, and electric forklifts), tools, and uninterruptible power supplies. Emerging applications in hybrid internal combustion-battery and electric vehicles are driving the technology to reduce cost, weight, size, and increase lifetime.

The rechargeable batteries used in the automotive industry are sometimes recalled or swapped out by automotive dealers. Not all recalled and swapped out rechargeable batteries are degraded. Therefore, these rechargeable batteries are tested to determine a level of degradation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
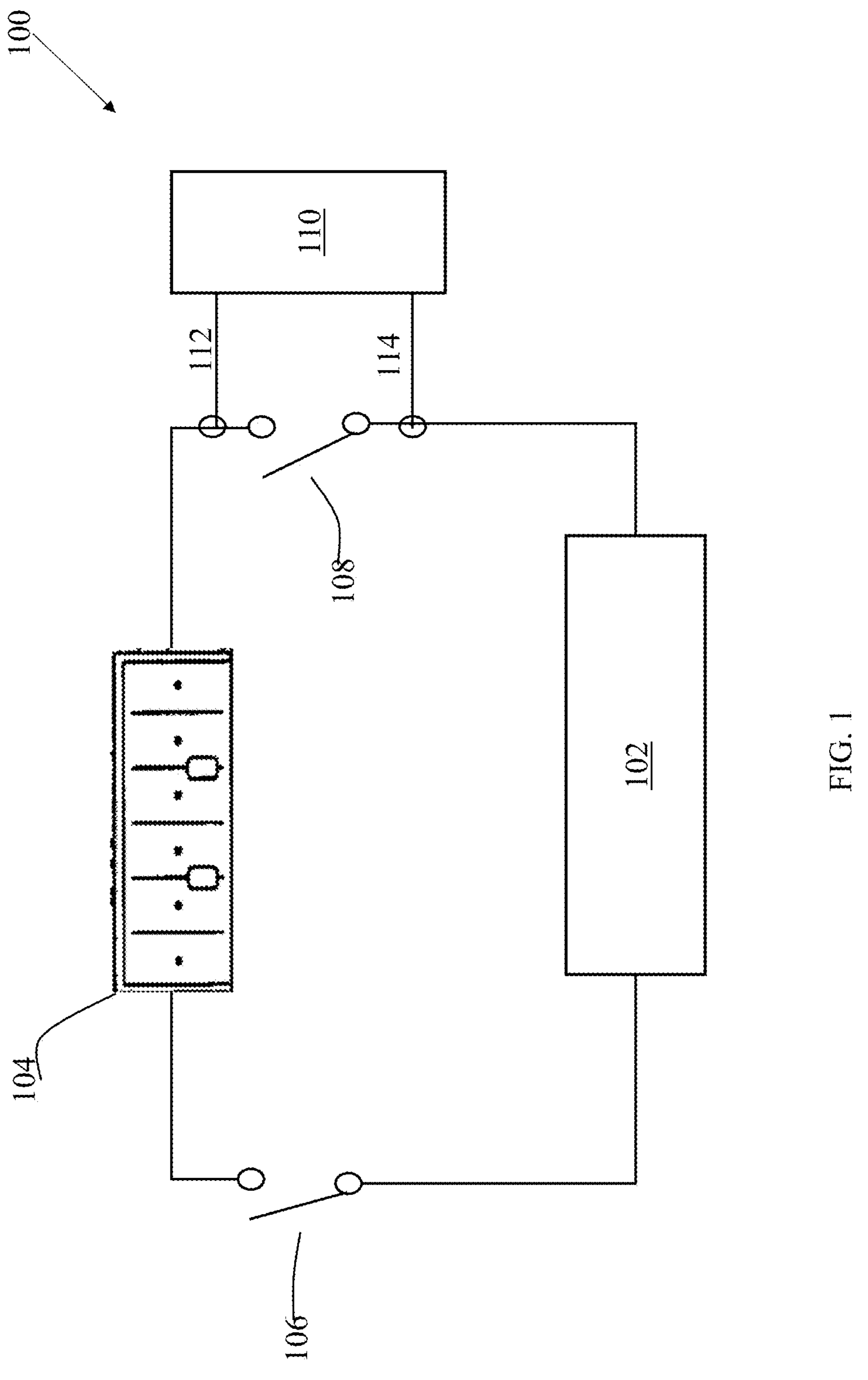
FIG. 1 is a diagram of an operating environment for a contact weld detector.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

During testing of electrochemical devices, multiple contacts are closed and opened. For example, a rechargeable battery is connected to a single power cycler using a first set of contacts to perform a test. The same rechargeable battery then is re-connected to another cycler or set of cyclers using another set of contacts to conduct another test. During these reconfigurations, it is important to make sure that open contacts are not welded. Welded contacts for example can cause short circuits and fire at the test facilities. Embodiments of the disclosure provide an apparatus and method for determining a status of a contactor (that is, whether a contactor is open/closed/welded or not). The disclosed apparatus (also referred to as a contact weld detector or a continuity monitor) is galvanically isolated from a contactor being monitored thereby minimizing another potential contact welding location.

FIG. 1 is a diagram illustrating an operating environment 100 for a contact weld detector. In some examples, operating environment 100 is a testing environment for electrochemical devices, for example, a rechargeable battery. As shown in FIG. 1, operating environment 100 includes a power cycler 102 and a battery under test 104. Operating environment 100 further includes a first contactor 106, a second contactor 108, and a contact weld detector 110 (also referred to as a continuity monitor). Contact weld detector 110 includes a first terminal 112 and a second terminal 114.

Battery under test 104 can be connected to power cycler 102 by closing first contactor 106 and second contactor 108. A negative terminal of power cycler 102 can be connected to a negative terminal battery under test 104 through first contactor 106. A positive terminal of power cycler 102 can be connected to a positive terminal of battery under test 104 through second contactor 108. Battery under test 104 is connected to power cycler 102 for testing.

Power cycler 102, in example embodiments, is configured to inject/withdraw a predetermined amount of current to/from battery under test 104. Power cycler 102, thus, can charge or discharge battery under test 104 by injecting current into or withdrawing current from battery under test 104. In an example embodiment, Power cycler 102 is connected to a power grid through a grid connection. Power cycler 102 may source power for charging battery under test 104 from the power grid. The power cycler 102 could source power for charging the battery under test 104 from any other power source. In addition, power cycler 102 can recycle any power harvested during discharging of battery under test 104 back to the power grid through the grid connection or to other receiving device.

Figure 2:
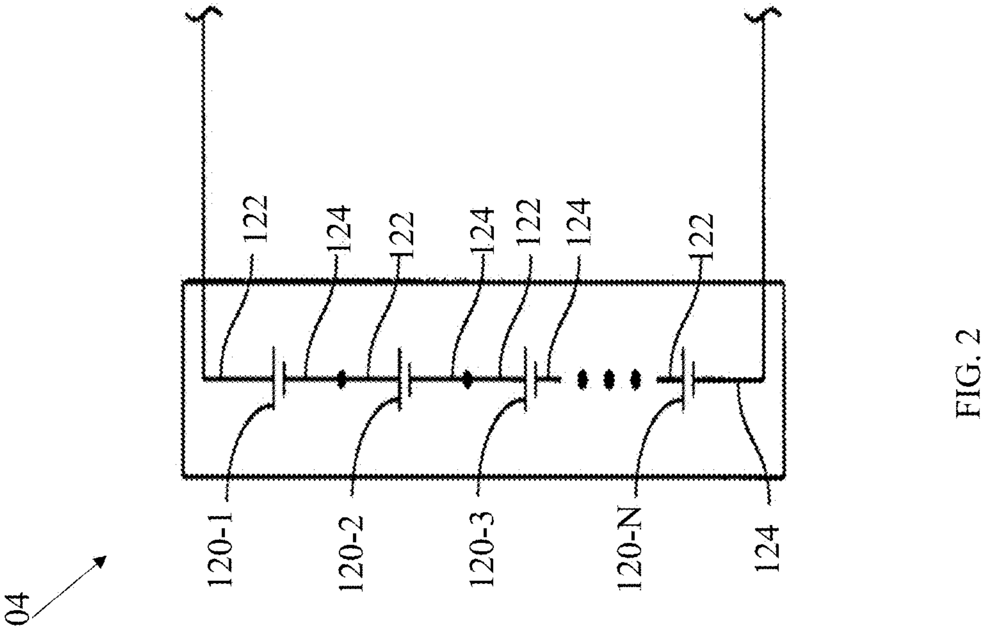
FIG. 2 is a diagram illustrating modules of a battery under test.

Battery under test 104 is a rechargeable battery. In some embodiments, battery under test 104 is recovered from a vehicle, for example, an electric vehicle. Battery under test 104 may include a plurality of battery modules connected together. In examples, a module may be the smallest unit of battery under test 104 without breaking any permanent mechanical systems. FIG. 2 illustrates an example battery under test 104. As shown in FIG. 2, battery under test 104 may include a plurality of battery modules, 120-1, 120-2, 120-3, . . . , 120-N connected together. It may be understood that battery under test 104 may include any number of battery modules. For example, battery under test 104 may include 28, 30, 38, 40, or 48 battery modules.

As shown in FIG. 2, each of the plurality of battery modules have a positive terminal 122 and a negative terminal 124. The plurality of battery modules can be combined in a series configuration in which positive terminal 122 of one of the plurality of battery modules is connected to negative terminal 124 of an adjacent battery module. In some arrangement, one or more battery modules are connected in parallel while some battery modules are connected in series. A total capacity and voltage rating of battery under test 104 may depend on a number of battery modules included in battery under test 104 and the connection configuration of the battery modules. Each of the plurality of battery modules may include one or more cells connected together. A capacity and voltage rating of a battery module may depend on a number of battery cells included in the battery module and connection configuration of the battery cells.

In some examples, one or more fuses may divide battery under test 104 into two or more sections or groupings. Battery sections are generally composed of a plurality of modules and may be structured for ease in disassembly and reconstituted through the use of removable hardware (e.g., threaded rods with removable nuts). These structures may arise for two reasons. First is the requirement for mechanical compression which may be required for proper functioning. Second, intermediate electrical equipment, such as fuses and contactors, are positioned for safety and operation. For example, fuses are typically located mid-battery pack so that removal of the fuse reduces battery voltage by half.

Figure 3:
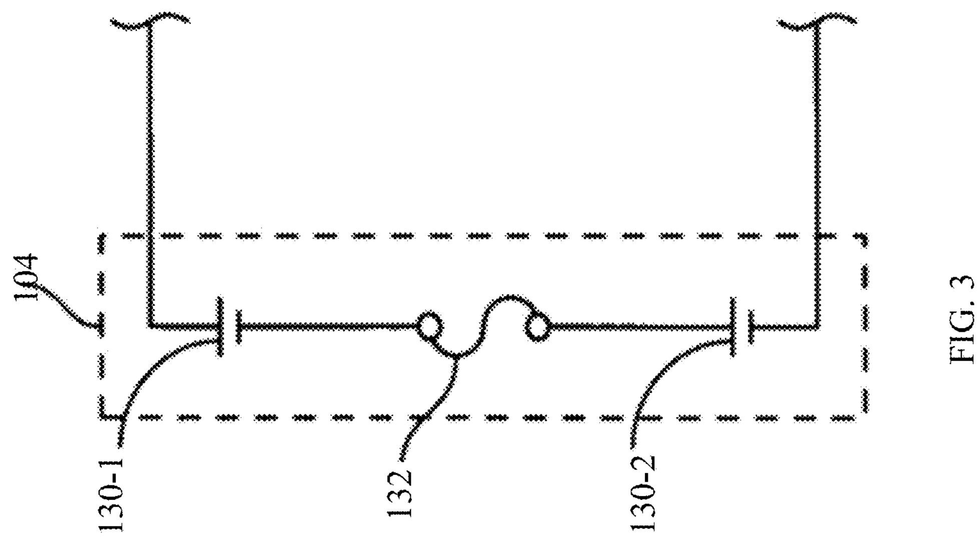
FIG. 3 is a diagram illustrating sections of a battery under test.

FIG. 3 is a diagram illustrating sections of battery under test 104. As shown in FIG. 3, battery under test 104 includes two sections, a first section 130-1 and a second section 130-2 connected by a fuse 132. Each of first section 130-1 and second section 130-2 may include multiple battery modules, for example, 28, 30, 38, 40, etc. A number of battery modules in each of first section 130-1 and second section 130-2 may be same or different depending on a design consideration of battery under test 104. In addition, battery under test 104 may include more than two modules and the modules do not have to be separated by fuse 132. Moreover, in some examples, if present, fuse 132 does not have to be between sections, and can be located anywhere along a current path. For example, fuse 132 can be located anywhere on exterior of battery under test 104 so that fuse 132 is more accessible by a user.

Returning to FIG. 1, contact weld detector 110 is connected across nodes of second contactor 108. For example, the first terminal 112 of contact weld detector 110 is connected to a first node of second contactor 108 and a second terminal 114 of contact weld detector 110 is connected to a second node of second contactor 108. As described in the following sections of the disclosure, contact weld detector 110 monitors and determines a status of a contact being established by the second contactor 108. That is, the contact weld detector 110 determines whether the second contactor 108 is welded or not. In some examples, the contact weld detector 110 can be connected across the first contactor 106 and can determine status of first contactor 106.

Figure 4:
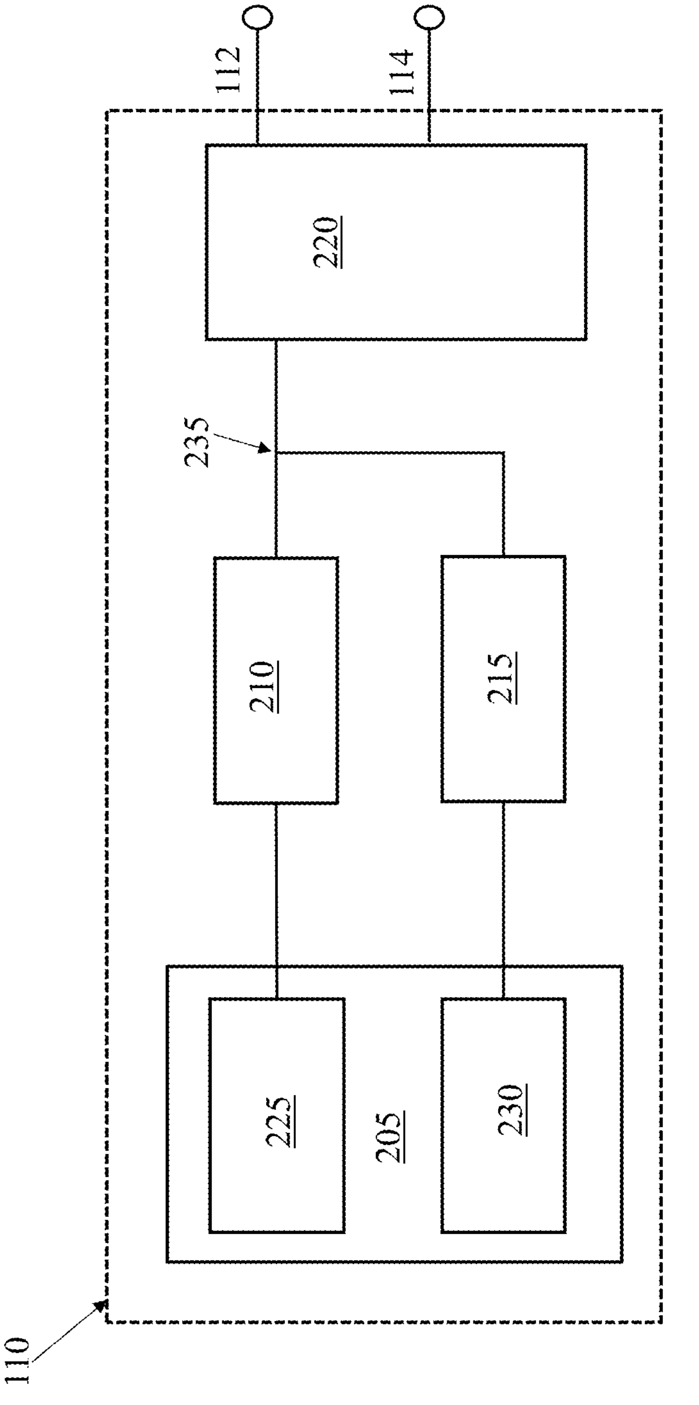
FIG. 4 is a block diagram illustrating a contact weld detector.

FIG. 4 is a block diagram illustrating the contact weld detector or a continuity monitor 110. As shown in FIG. 4, the contact weld detector 110 includes a controller 205, a low pass filter 210, a peak detector 215, and an isolator 220. The Controller 205 may include a signal generator 225 and an analog to digital convertor 230. The Signal generator 225 is connected to a first terminal of low pass filter 210. A second terminal of low pass filter 210 is connected to internal node 235. An input terminal of the isolator 220 is connected to the internal node 235. Analog to digital convertor 230 is connected to a first terminal of peak detector 215. A second terminal of peak detector 215 is connected to internal node 235.

Controller 205 determines a status of second contactor 108 (that is, whether second contactor 108 is welded or not). In one example, signal generator 225 generates an excitation signal. The excitation signal, for example, can be a pulse signal with a predetermined frequency and amplitude. In one example, the excitation signal is a pulse signal of 20 MHz frequency and an amplitude of IV. The excitation signal is provided to low pass filter 210. In some examples, the low pass filter 210 converts the excitation signal into a sine wave signal. The sine wave signal is provided to the input terminal of isolator 220. The Isolator 220 couples or propagates the sine wave signal to second contactor 108 through first terminal 112 and second terminal 114. In some examples, isolator 220 is a resonant circuit. In some examples, the low pass filter 210 may convert the excitation signal into a signal of any other shape.

Based on an impedance between first terminal 112 and second terminal 114, some of the sine wave signal is reflected back towards controller 205 and resonates with the sine wave signal. The Peak detector 215 measures a peak value (that is, an amplitude) of a resultant signal and provides the measured peak value to analog to digital convertor 230 of controller 205.

The Controller 205 then determines whether second contactor 108 is welded by comparing the measured peak value with a predetermined value. For example, controller 205 determines second contactor 108 as welded when the determined peak value is greater than the predetermined value. In some examples, the sine wave signal is reflected back towards isolator 220 and may resonate with the sine wave signal when second contactor 108 is welded. A resulting signal (that is a combination of the sine wave signal and reflected signal) may have a higher peak (that is, amplitude) than the sine wave signal. Hence, by measuring the peak value of the resulting signal and comparing the measured peak value with the predetermined value provides an indication of whether second contactor 108 is welded or not. Controller 205 determines the second contactor 108 as not welded when the determined peak value is not greater than the predetermined value. In some examples, the predetermined value is greater than a peak value of the excitation signal.

Figure 5:
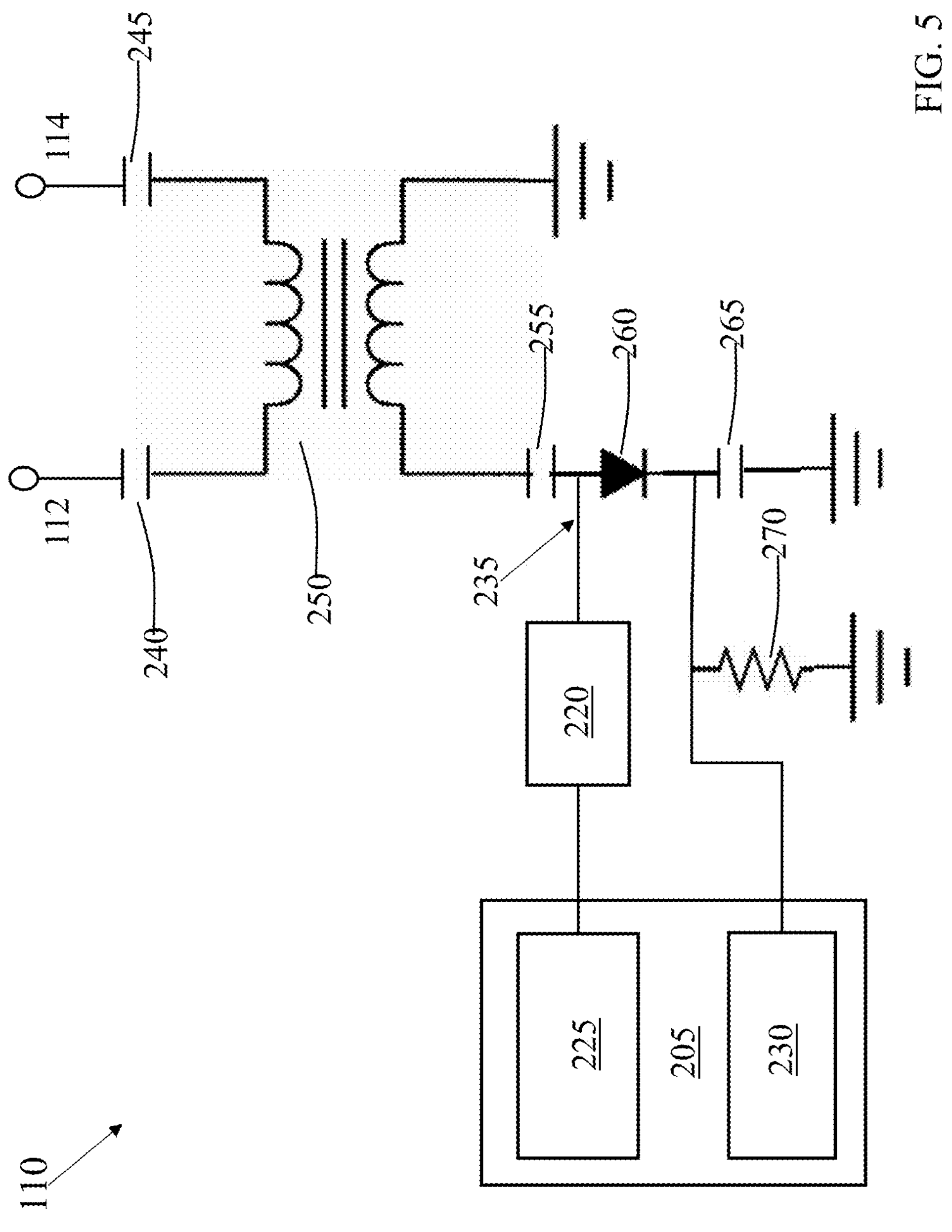
FIG. 5 is a partial block diagram and a partial circuit diagram illustrating a contact weld detector.

FIG. 5 is a partial block diagram and partial circuit diagram illustrating contact weld detector 110. As shown in FIG. 5, contact weld detector 110 includes the controller 205 and the low pass filter 210. Controller 205 includes signal generator 225 and analog to digital convertor 230. In addition, contact weld detector 110 includes a first capacitor 240, a second capacitor 245, a transformer 250, a third capacitor 255, a switch 260, a fourth capacitor 265, and a resistor 270.

A first terminal of the first capacitor 240 is connected to or forms first terminal 112 of contact weld detector 110. A second terminal of first capacitor 240 is connected to a first output terminal of transformer 250. A first terminal of second capacitor 245 is connected to or forms second terminal 114 of contact weld detector 110. A second terminal of second capacitor 245 is connected to a second output terminal of transformer 250. In some examples, each of first capacitor 240 and second capacitor 245 are of 2 nF. However, a different capacity is possible for each of first capacitor 240 and second capacitor 245. In examples, first capacitor 240 and second capacitor 245 provide a first level of circuit isolation for second contactor 108 as well as contact weld detector 110. That is, first capacitor 240 and second capacitor 245 do not allow or suppress flow of current from battery under test 104 to contact weld detector 110. This minimizes any interference in testing of battery under test 104 by contact weld detector 110.

A second input terminal of transformer 250 may be connected to the ground. A first input terminal of transformer 250 is connected to a first terminal of third capacitor 255. Transformer 250, therefore, is connected between third capacitor 255 and first and second capacitors 240, 245. Hence, transformer 250 provides a second level of circuit isolation for second contactor 108 as well as the contact weld detector 110. That is, transformer 250 does not allow or suppresses flow of current from battery under test 104 to contact weld detector 110.

A second terminal of third capacitor 255 is connected to internal node 235. Hence, third capacitor 255 provides a third level of circuit isolation for the second contactor 108 as well as the contact weld detector 110. In some examples, one or more of first and second capacitors 240, 245, transformer 250, and third capacitor 255, therefore, form isolator 220. In some examples, the terminals of the transformer 250 are interchangeable. That is, the input terminals of transformer 250 can be its output terminals and vice versa. In some examples, isolator 220 is a galvanic transformer.

A first terminal of switch 260 is connected to internal node 235. A second terminal of switch 260 is connected to a first terminal of fourth capacitor 265. A second terminal of fourth capacitor 265 is connected to the ground. A first terminal of resistor 270 is connected to the second terminal of switch 260 and the first terminal of capacitor 265. A second terminal of resistor 270 is connected to the ground. Switch 260, fourth capacitor 265, and resistor 270 together in combination determine the peak value of resonant signal detected at internal node 235. In some examples, switch 260 is a transistor switch or a diode and allows flow of signal from internal node 235 towards fourth capacitor 265 and resistor 270.

The elements described above of contact weld detector 110 (e.g., controller 205, low pass filter 210, peak detector 215, isolator 220, signal generator 225, and analog to digital convertor 230) may be practiced in hardware and/or in software (including firmware, resident software, micro-code, etc.) or in any other circuits or systems. The elements of contact weld detector 110 may be practiced in electrical circuits comprising discrete electronic elements, packaged or integrated electronic chips containing logic gates, a circuit utilizing a microprocessor, or on a single chip containing electronic elements or microprocessors. Furthermore, the elements of contact weld detector 110 may also be practiced using other technologies capable of performing logical operations such as, for example, AND, OR, and NOT, including but not limited to, mechanical, optical, fluidic, and quantum technologies. As described in greater detail below with respect to FIG. 7, the elements of contact weld detector 110 may be practiced in a computing device 400.

Figure 6:
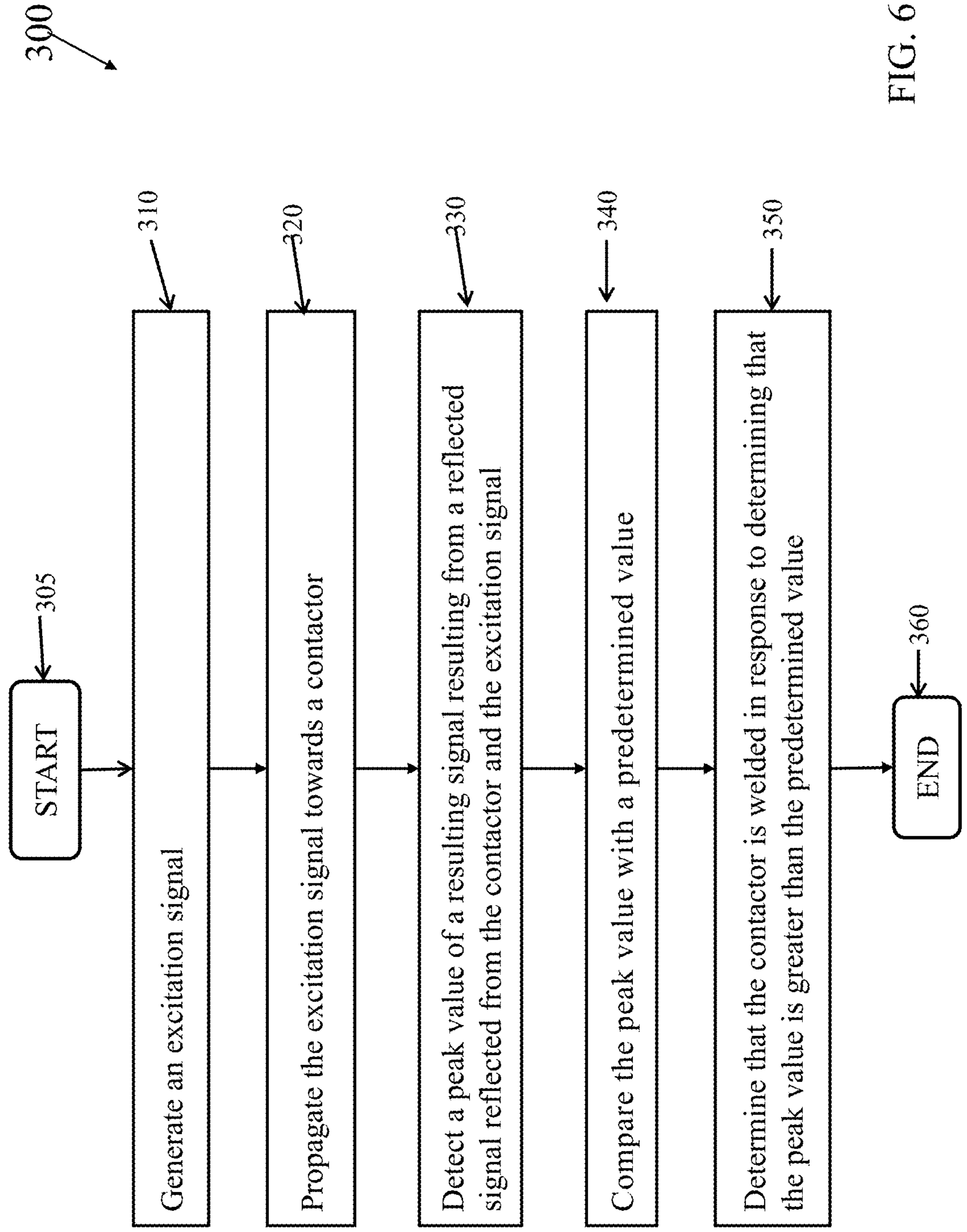
FIG. 6 is a flow diagram of a method of determining a status of a contact.

FIG. 6 is a flow chart setting forth the general stages involved in a method 300 consistent with an embodiment of the disclosure for determining a status of a contactor, for example, second contactor 108. Method 300 may be performed by contact weld detector 110. Ways to implement the stages of method 300 will be described in greater detail below.

Method 300 begins at starting block 305 and proceeds to stage 310 where contact weld detector 110 generates an excitation signal. In some examples, signal generator 225 of controller 205 of contact weld detector 110 generates the excitation signal. The excitation signal has a predetermined frequency and amplitude. In one example, the excitation signal is a pulse signal of 20 KHz with an amplitude of IV. Low pass filter 220 that is connected to signal generator 225 generates a sine wave signal from the pulse signal.

After generating the excitation signal at stage 320, method 300 proceeds to stage 320 where contact weld detector 110 propagates the excitation signal towards second contactor 108. For example, isolator 220 of contact weld detector 110 propagates the sine wave signal derived from the excitation signal to second contactor 108.

Once having propagated the excitation signal towards second contactor 108 at stag 330, method 300 proceeds to stage 340 where contact weld detector 110 detects a peak value of a resultant signal reflected from second contactor 108. For example, peak detector 215 of contact weld detector 110 detects an amplitude of the resultant signal resulting from a combination of the sine wave signal and reflected signal from second contactor 108.

After detecting the peak value of the resonant signal reflected from the contact at stage 340, method 300 proceeds to stage 350 where contact weld detector 110 compares the peak value with a predetermined value. The predetermined value is provided by a user to contact weld detector 110 or controller 205 of contact weld detector 110.

Once having compared the peak value with the predetermined value at stage 340, method 300 proceeds to stage 350 where contact weld detector 110 determines that second contactor 108 is welded in response to determining that the peak value is greater than the predetermined value. For example, controller 205 compares the peak value with the predetermined value. When the peak value is greater than the predetermined value, controller 205 determines the status of second contactor 108 as welded. But, when the peak value is not greater than the predetermined value, controller 205 determines the status of second contactor 108 as not welded. Once having determined that the contact is welded at stage 350, method 300 may stop at END stage 360.

Although contact weld detector 110 and method 300 is described with respect to determining a status of a contactor, contact weld detector 110 and method 300 can be used to determine a status (that is, welding) of any type of contacts or non-contacts.

Figure 7:
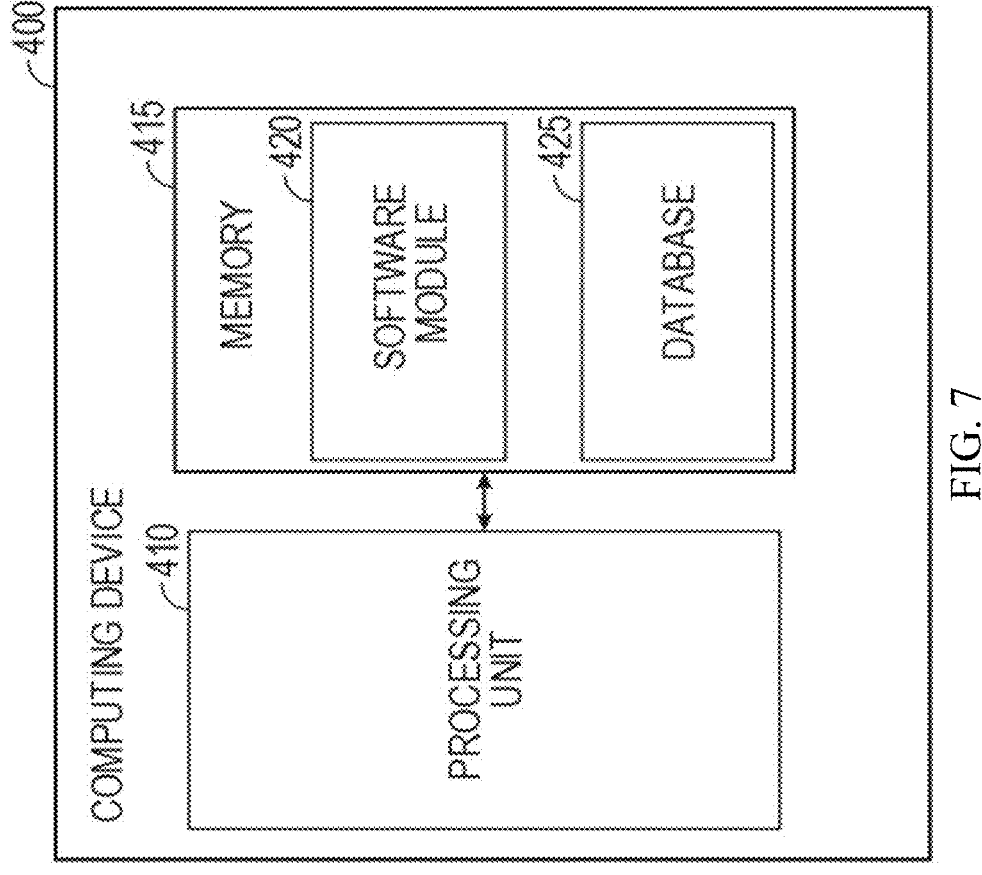
FIG. 7 is a block diagram of a computing device.

FIG. 7 shows computing device 400. As shown in FIG. 7, computing device 400 includes a processing unit 410 and a memory unit 415. Memory unit 415 includes a software module 420 and a database 425. While executing on processing unit 410, software module 420 performs, for example, processes for determining a status of a contact, including for example, any one or more of the stages from method 300 described above with respect to FIG. 6. Computing device 400, for example, provides an operating environment for power cycler 102, contact weld detector 110, controller 205, low pass filter 210, peak detector 215, signal generator 225, and analog to digital convertor 230. Power cycler 102, contact weld detector 110, controller 205, low pass filter 210, peak detector 215, signal generator 225, and analog to digital convertor 230 may operate in other environments and are not limited to computing device 400.

Computing device 400 can be implemented using a tablet device, a mobile device, a smart phone, a telephone, a remote control device, a personal computer, a network computer, a mainframe, a router, a switch, a server cluster, a smart TV-like device, a network storage device, a network relay device, or other similar microcomputer-based device.

Computing device 400 can include any computer operating environment, such as hand-held devices, multiprocessor systems, microprocessor-based or programmable sender electronic devices, minicomputers, mainframe computers, and the like. Computing device 400 can also be practiced in distributed computing environments where tasks are performed by remote processing devices. The aforementioned systems and devices are examples and computing device 400 can comprise other systems or devices.

Embodiments of the disclosure, for example, can be implemented as a computer process (method), a computing system, or as an article of manufacture, such as a computer program product or computer readable media. The computer program product can be a computer storage media readable by a computer system and encoding a computer program of instructions for executing a computer process. The computer program product can also be a propagated signal on a carrier readable by a computing system and encoding a computer program of instructions for executing a computer process. Accordingly, the present disclosure can be embodied in hardware and/or in software (including firmware, resident software, micro-code, etc.). In other words, embodiments of the present disclosure can take the form of a computer program product on a computer-usable or computer-readable storage medium having computer-usable or computer-readable program code embodied in the medium for use by or in connection with an instruction execution system. A computer-usable or computer-readable medium can be any medium that can contain, store, communicate, propagate, or transport the program for use by or in connection with the instruction execution system, apparatus, or device.

The computer-usable or computer-readable medium can be, for example but not limited to, an electronic, magnetic, optical, electromagnetic, infrared, or semiconductor system, apparatus, device, or propagation medium. More specific computer-readable medium examples (a non-exhaustive list), the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, or a CD-ROM, a carrier wave from the Internet, or other forms of RAM or ROM. Further, the disclosed methods' stages may be modified in any manner, including by reordering stages and/or inserting or deleting stages, without departing from the disclosure.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to, mechanical, optical, fluidic, and quantum technologies. In addition, embodiments of the disclosure may be practiced within a general purpose computer or in any other circuits or systems.

Embodiments of the disclosure may be practiced via a system-on-a-chip (SOC) where each or many of the element illustrated in FIGS. 1-5 may be integrated onto a single integrated circuit. Such a SOC device may include one or more processing units, graphics units, communications units, system virtualization units and various application functionality all of which may be integrated (or "burned") onto the chip substrate as a single integrated circuit. When operating via a SOC, the functionality described herein with respect to embodiments of the disclosure, may be performed via application-specific logic integrated with other components of computing device 400 on the single integrated circuit (chip).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. An apparatus for determining a status of a contactor, the apparatus comprising:

- a controller comprising a signal generator, wherein the signal generator is configured to generate an excitation signal;
- an isolator connected to the controller, wherein the isolator is configured to propagate the excitation signal to a contactor;
- a low pass filter connected between the signal generator and the isolator, wherein the low pass filter is configured to convert the excitation signal into a sine wave signal;
- a peak detector connected to the controller, wherein the peak detector detects a peak value of a resonant signal resulting from reflection of the excitation signal from the contact; and
- wherein the controller is configured to:
  - compare the peak value with a predetermined value, and
  - determine a status of the contactor based on the comparison.

2. The apparatus of claim 1, wherein the controller being configured to determine the status of the contact based on the comparison comprises the controller being configured to:

- determine that the contact is welded when the peak value is greater than the predetermined value.

3. The apparatus of claim 1, wherein the controller being configured to determine the status of the contact based on the comparison comprises the controller being configured to:

determine that the contact is not welded when the peak value is not greater than the predetermined value.

4. The apparatus of claim 1, wherein the isolator comprises a galvanic transformer.

5. The apparatus of claim 1, wherein the apparatus is connected across the contact.

6. The apparatus of claim 1, wherein the controller further comprises an analog to digital convertor, and wherein the analog to digital convertor is connected to the peak detector.

7. The apparatus of claim 1, wherein the isolator comprises a transformer, wherein a first output terminal of the transformer is connected to a first node of the contact, wherein a second output terminal of the transformer is connected to a second node of the contact, wherein a first input terminal of the transformer is connected to the controller, and wherein a second input terminal of the transformer is connected to the ground.

8. The apparatus of claim 1, wherein the isolator comprises a first capacitor, a second capacitor, and a transformer, wherein a first terminal of the first capacitor is connected to a first node of the contact, wherein a first terminal of the second capacitor is connected to a second node of the contact, wherein a second terminal of the first capacitor is connected to a first output terminal of the transformer, wherein a second terminal of the second capacitor is connected to a second output terminal of the transformer, wherein a first input terminal of the transformer is connected to the controller, and wherein a second input terminal of the transformer is connected to the ground.

9. A contact weld detector comprising:

a controller comprising a signal generator, wherein the signal generator is configured to generate an excitation signal;

a transformer configured to propagate the excitation signal to a contact, wherein a first output terminal of the transformer is connected to a first node of the contact, wherein a second output terminal of the transformer is connected to a second node of the contact, wherein a first input terminal of the transformer is connected to the controller, and wherein a second input terminal of the transformer is connected to the ground;

a low pass filter connected between the signal generator and the transformer, wherein the low pass filter is configured to convert the excitation signal into a sine wave signal; and a peak detector connected to the controller and transformer, wherein the peak detector detects a peak value of a resonant signal resulting from reflection of the excitation signal from the contact, wherein the controller is configured to determine a status of the contact based on the peak value.

10. The contact weld detector of claim 9, the controller being configured to determine the status of the contact based on the peak value comprises the controller being configured to:

determine that the contact is welded when the peak value is greater than a predetermined value.

11. The contact weld detector of claim 9, the controller being configured to determine the status of the contact based on the peak value comprises the controller being configured to:

determine that the contact is not welded when the peak value is not greater than a predetermined value.

12. The contact weld detector of claim 9, wherein the controller further comprises an analog to digital convertor, and wherein the analog to digital convertor is connected to the peak detector.

13. The contact weld detector of claim 9, further comprising a first capacitor and a second capacitor, wherein the first capacitor is connected between the first output terminal of the transformer and the first node of the contact, wherein the second capacitor is connected between the second output terminal of the transformer and the second node of the contact.

14. The contact weld detector of claim 9, further comprising a third capacitor connected between the first input terminal of the transformer and the controller.

15. A method of determining a status of a contact, the method comprising:

generating, a signal generator, an excitation signal;

propagating, through an isolator connected to the signal generator, the excitation signal towards a contactor;

converting, by a low pass filter connected between the signal generator and the isolator, the excitation signal into a sine wave signal detecting, through a peak detector, a peak value of a resulting signal resulting from a reflected signal reflected from the contactor and the excitation signal;

comparing, by a controller, the peak value with a predetermined value; and determining, by the controller, that the contactor is welded in response to determining that the peak value is greater than the predetermined value.

16. The method of claim 15, wherein detecting the peak value comprises detecting an amplitude of the resonant signal.

17. The method of claim 15, further comprising:

determining that the contact is not welded in response to determining that the peak value is not greater than the predetermined value.

18. The method of claim 15, wherein the excitation signal comprises a sine wave signal.

19. The contact weld detector of claim 9, wherein the transformer comprises a galvanic transformer.

20. The contact weld detector of claim 9, wherein the controller further comprises an analog to digital convertor, and wherein the analog to digital convertor is connected to the peak detector.

* * * * *